United States Patent
Motsch et al.

(10) Patent No.: US 8,294,033 B2
(45) Date of Patent: Oct. 23, 2012

(54) CIRCUIT BOARD AND METHOD OF PRODUCING A CIRCUIT BOARD

(75) Inventors: Hans-Werner Motsch, Ingolstadt (DE); Florian Schels, Seubersdorf (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 341 days.

(21) Appl. No.: 12/622,498

(22) Filed: Nov. 20, 2009

(65) Prior Publication Data

US 2010/0122837 A1    May 20, 2010

Related U.S. Application Data

(60) Provisional application No. 61/116,450, filed on Nov. 20, 2008.

(30) Foreign Application Priority Data

Nov. 21, 2008 (DE) .......................... 10 2008 058 490

(51) Int. Cl.
*H05K 1/03* (2006.01)
(52) U.S. Cl. ........................................ 174/255; 174/254
(58) Field of Classification Search .................. None
See application file for complete search history.

(56) References Cited

U.S. PATENT DOCUMENTS

| | | | |
|---|---|---|---|
| 4,758,459 A | | 7/1988 | Mehta |
| 5,495,076 A | * | 2/1996 | Davis ............................. 174/254 |
| 5,518,964 A | | 5/1996 | DiStefano et al. |
| 5,801,441 A | | 9/1998 | DiStefano et al. |
| 5,903,441 A | * | 5/1999 | Dean et al. .................... 361/756 |
| 5,984,693 A | | 11/1999 | McHugh et al. |
| 6,396,709 B1 | | 5/2002 | Schmich |
| 7,212,413 B2 | | 5/2007 | Chang et al. |
| 7,948,760 B2 | * | 5/2011 | Kawauchi et al. ............ 361/749 |

FOREIGN PATENT DOCUMENTS

| | | |
|---|---|---|
| DE | 29504736 U1 | 7/1995 |
| DE | 4412278 A1 | 10/1995 |
| DE | 199 14 418 A1 | 10/2000 |
| DE | 019225153 A1 * | 12/2003 |

OTHER PUBLICATIONS

German Office Action dated Jun. 25, 2009.

* cited by examiner

*Primary Examiner* — Ishwarbhai Patel
(74) *Attorney, Agent, or Firm* — Laurence A. Greenberg; Werner H. Stemer; Ralph E. Locher

(57) ABSTRACT

A rigid circuit board is provided which contains at least one integral limb shaped to provide predetermined movement at a free end of the limb in at least two mutually perpendicular planes. The rigid circuit board provides a rewiring structure at a low cost and is adaptable for use in a wide range of applications.

8 Claims, 4 Drawing Sheets

CIRCUIT BOARD AND METHOD OF PRODUCING A CIRCUIT BOARD

CROSS-REFERENCE TO RELATED APPLICATION

This application claims the priority, under 35 U.S.C. §119(e), of provisional application No. 61/116,450, filed Nov. 20, 2008; this application also claims the priority, under 35 U.S.C. §119, of German patent application No. DE 10 2008 058 490.8, filed Nov. 21, 2008; the prior applications are herewith incorporated by reference in their entirety.

BACKGROUND OF THE INVENTION

Field of the Invention

The invention relates to a circuit board and to a method of producing the circuit board.

Circuit boards, also commonly referred to as printed circuit boards or printed wiring boards, provide a structure by which electrical signals and/or power can be transferred from one point to another point over a desired distance. A circuit board can also mechanically support components mounted on it. Circuit boards typically have an electrically insulating substrate and a plurality of electrically conductive tracks or lines arranged on the electrically insulating substrate in a desired pattern so as to provide the desired rewiring arrangement.

The material of the substrate may be selected so as to provide a rigid circuit board, for example, a fiber-reinforced epoxy board or a ceramic plate may be used as the substrate. However, for some applications a more complicated, three-dimensional, rewiring structure is required.

A three-dimensional rewiring structure may be provided by a flexible tape or a foil substrate, such as a polyimide foil, which can be bent and/or folded to provide a flexible circuit board extending in three-dimensions. An arrangement containing two inter-locking flexible circuit boards for a liquid crystal display is known from U.S. Pat. No. 7,212,413.

Although flexible circuit boards have the advantage of providing an adaptable three-dimensional rewiring structure, flexible circuit boards are, at present, typically more expensive than rigid circuit boards. It is generally desirable to reduce the costs of components so as to be able to reduce the cost of the goods produced or to increase the profit margin.

SUMMARY OF THE INVENTION

It is accordingly an object of the invention to provide a circuit board and a method of producing the circuit board, which overcome the above-mentioned disadvantages of the prior art methods and devices of this general type, which provides a rewiring structure at low cost which is adaptable for use in a wide range of applications.

The invention provides a rigid circuit board containing at least one integral limb shaped to provide predetermined movement at a free end of the limb in at least two mutually perpendicular planes.

As used herein, rigid is used to exclude a flexible circuit board of the foil or tape-based type, for example a polyimide-based tape. Integral is used herein to denote that the limb and other adjoining portion of the rigid circuit board are a single piece. Limb is used herein to denote a protrusion which may be generally elongate.

A rigid circuit board is provided which can be manufactured from materials associated with lower raw materials costs that at the same time contains at least one region, in particular, the free end of the integral limb, which is movable. This movement can be used to provide a rigid circuit board with spatial tolerance compensation provided by the free end of the limb.

For example, the predetermined movement can accommodate small changes in the position of a component which is to be mounted on or connected to the circuit board. The movement may also be predetermined to provide spatial tolerance of the free end of the limb if this free end of the limb is to fit with a second connector or is to fit into a slot or through-hole.

Control systems for mechatronic applications are often used in aggressive environments, such as in an engine or in the hot oil of the gear box. The electronic components are housed within a sealed module including a connection through the housing of the module to enable the components within to be connected to further components outside of the housing. The moveable free end of the limb can provide dimensional tolerance to compensate for variations in the manufacturing tolerance of the housing and/or rigid circuit board, so that the free end of the limb can reliably fit into the connection in the housing.

The limb is shaped so as to provide movement in at least two mutually perpendicular directions of a region of the limb which is peripheral to the region of the limb which is shaped. In particular, the length of the limb is shaped to provide movement at the free end of the limb in at least two mutually perpendicular directions.

In an embodiment, the free end of the limb contains at least one contact region. The contact region may have any desirable form, for example, a contact pad or contact pin or contact socket.

The contact region may be arranged at the most moveable portion of the limb, that is at the free end to provide a reliable electrical connection to the rigid circuit board.

In a further embodiment, the limb is shaped to provide predetermined movement in three mutually perpendicular planes. The limb may also be shaped to provide three-dimensional resilience of the free end of the limb. Three-dimensional resilience may be used to provide a good electrical contact between a contact region at the free end and a further component by providing the electrical connection with at least some springiness.

The limb may be shaped in a variety of ways in order to produce a predetermined movement at the free end of the limb. For example the length of the limb may include a fold, a kink and/or a narrowed portion.

In an embodiment, the limb extends in at least one loop, the loop being shaped to provide a predetermined movement at the free end of the limb. The limb is, therefore, not straight but has a meandering form.

The loop may be a generally U-shaped loop with an open side and a closed side wherein the open side is arranged in the plane of the rigid circuit board and the closed end is arranged out of the plane of the circuit board.

Such a shape is easy to fabricate by stamping the desired form of the rigid circuit board and then bending the rigid circuit in the region of the closed end of the loop. A rigid circuit board can be bent by bending it around a former. Heat may also be applied while bending the rigid circuit board.

The loop may be bent so that it contains a radius of curvature of between 5 mm and 30 mm. The minimum radius of curvature which is possible without breaking the board may be dependent on the brittleness of the materials of the rigid circuit board as well as on the thickness of the rigid circuit board. The radius of curvature can also be selected so as to provide the desired predetermined movement.

The rigid circuit board of the present application may be formed using a conventional rigid circuit board and may contain an electrically insulating substrate containing one of FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Woven glass and epoxy), CEM-4 (Woven glass and epoxy), and CEM-5 (Woven glass and polyester).

The rigid circuit board may be single sided and include electrically conductive tracks arranged on a single side of an electrically insulating rigid substrate. The rigid circuit board may, however, also be double-sided with tracks arranged on both the opposing major surfaces and may further include electrically conductive vias to connect the tracks on the two opposing major surfaces with each other. The rigid circuit board may also be a multi-layer circuit board.

The application also provides a mechatronic control system containing a rigid circuit board according to one of the previously described embodiments. In an embodiment, the mechatronic control system is a automatic gear box control module.

In a further embodiment, the rigid circuit board contains a plurality of bent portions, wherein electronic components of the mechatronic control system are arranged on, and/or electrically connected to, the bent portions. The bent portions may or may not be moveable in a predetermined manner. The bent portions may be used to provide a rigid circuit board having a three-dimensional contour. A three-dimensional contour enables the form of the rigid circuit board to be adapted to the position of the mechanical components.

The application also provides a method of providing spatial tolerance compensation in a rigid circuit board. A rigid circuit board is provided which contains at least one integral limb. The limb is shaped so as to provide predetermined movement of a free end of the limb in at least two mutually perpendicular planes.

The rigid circuit board can be simply and easily manufactured to provide a rigid circuit board which also has at least one moveable portion providing spatial tolerance.

In a first embodiment, a precursor rigid circuit board is so shaped that the free end of the limb contains the at least one contact region. The precursor rigid circuit board may be provided having a general square or rectangular outline having the desired rewiring structure in the form of electrically conductive tracks and contact regions. A board with a square or rectangular outline is simpler and cheaper to manufacture in large batches.

This precursor rigid circuit board can then be shaped so as to provide at least one integral limb and shaped so that at least one contact region is arranged at the free end of the limb.

The precursor rigid circuit board may be shaped by stamping to provide a limb as well as to provide a limb with a loop extending in the plane of the limb.

After the rigid circuit board with at least one integral loop has been stamped out of the precursor rigid circuit board, the loop may be bent in a direction out of the plane of the limb. At least a portion of the loop, therefore, extends in directions out of the plane of the limb so as to provide movement at the free end of the limb in at least two mutually perpendicular directions.

In a further embodiment, the loop is permanently bent in a direction out of the plane of the limb, that is, after the pressure is released, the position of the limb out of the plane is largely maintained.

Other features which are considered as characteristic for the invention are set forth in the appended claims.

Although the invention is illustrated and described herein as embodied in a circuit board and a method of producing the circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
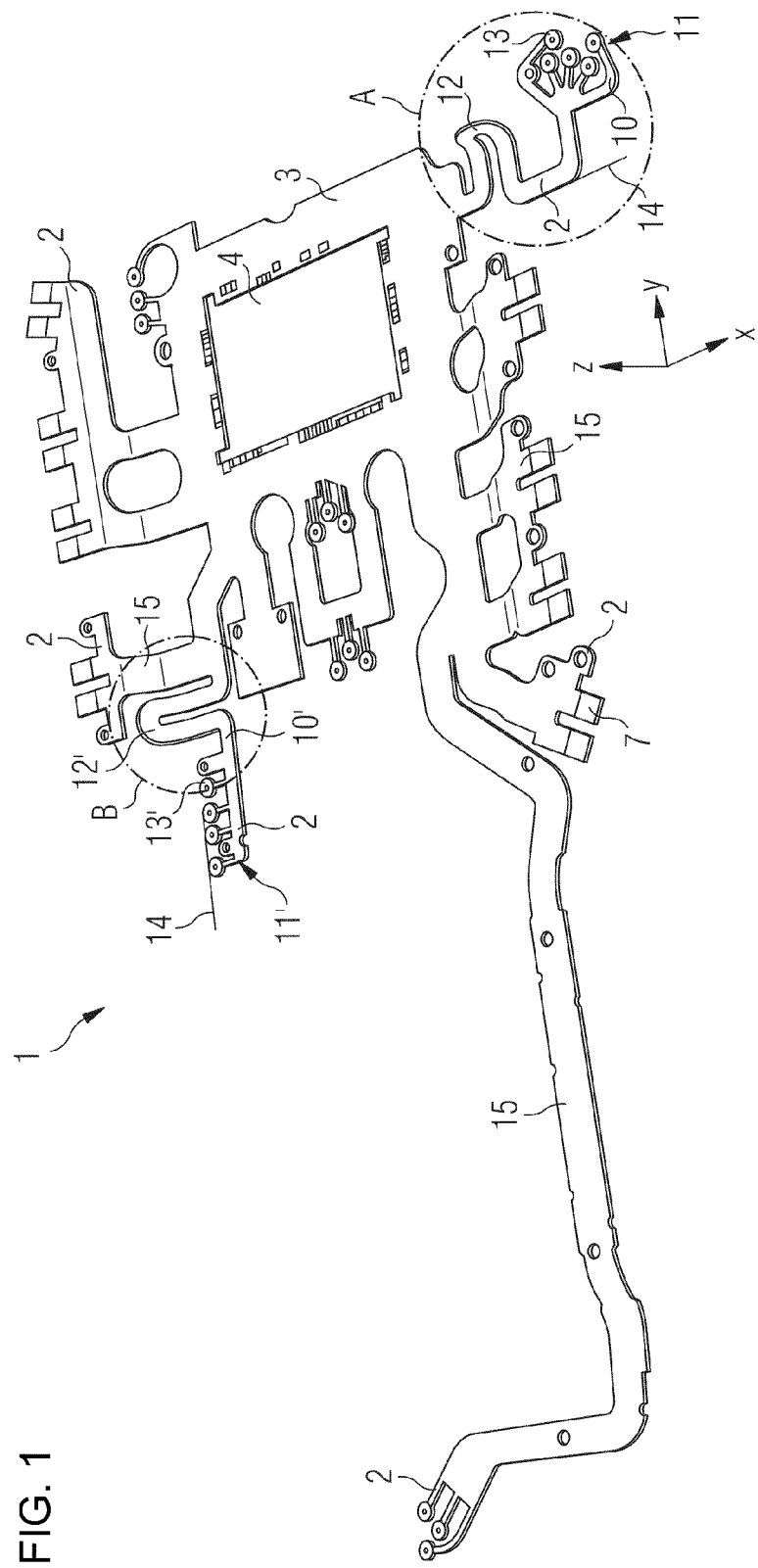
FIG. 1 is a diagrammatic, perspective view of a rigid circuit board according to an embodiment of the invention.

Referring now to the figures of the drawing in detail and first, particularly, to FIG. 1 thereof, there is shown a perspective view of a rigid circuit board 1 according to a first embodiment.

The rigid circuit board 1 is shaped to contain a plurality of integral limbs 2 extending from a central region 3 containing a generally rectangular through-hole 4 for accommodating a non-illustrated electronic module containing a plurality of electronic components.

Figure 4:
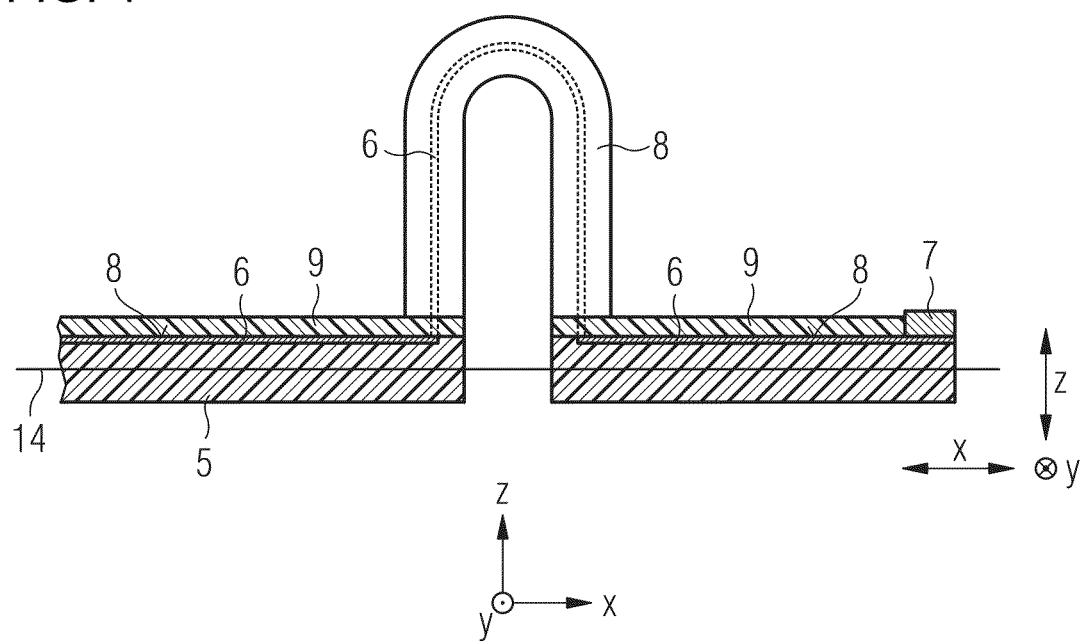
FIG. 4 is a diagrammatic, partial cross-sectional view of the rigid circuit board.

The structure of the rigid circuit board is illustrated in the partial cross-sectional view of FIG. 4. The rigid circuit board 1 contains a dielectric substrate 5 and a plurality of electrically conductive copper tracks 6 and contact regions 7 arranged on a top surface 8 of the dielectric substrate 5. The copper tracks are covered with a further insulating layer 9 which leaves the contact regions 7 exposed. In further non-illustrated embodiments, the rigid circuit board 1 has a double-sided or multilayer structure.

The rigid circuit board 1 contains two integral limbs 10, 10' which are shaped so as to provide a predetermined movement at a free end 11, 11' of the limb 10, 10' in at least two mutually perpendicular planes.

Figure 2:
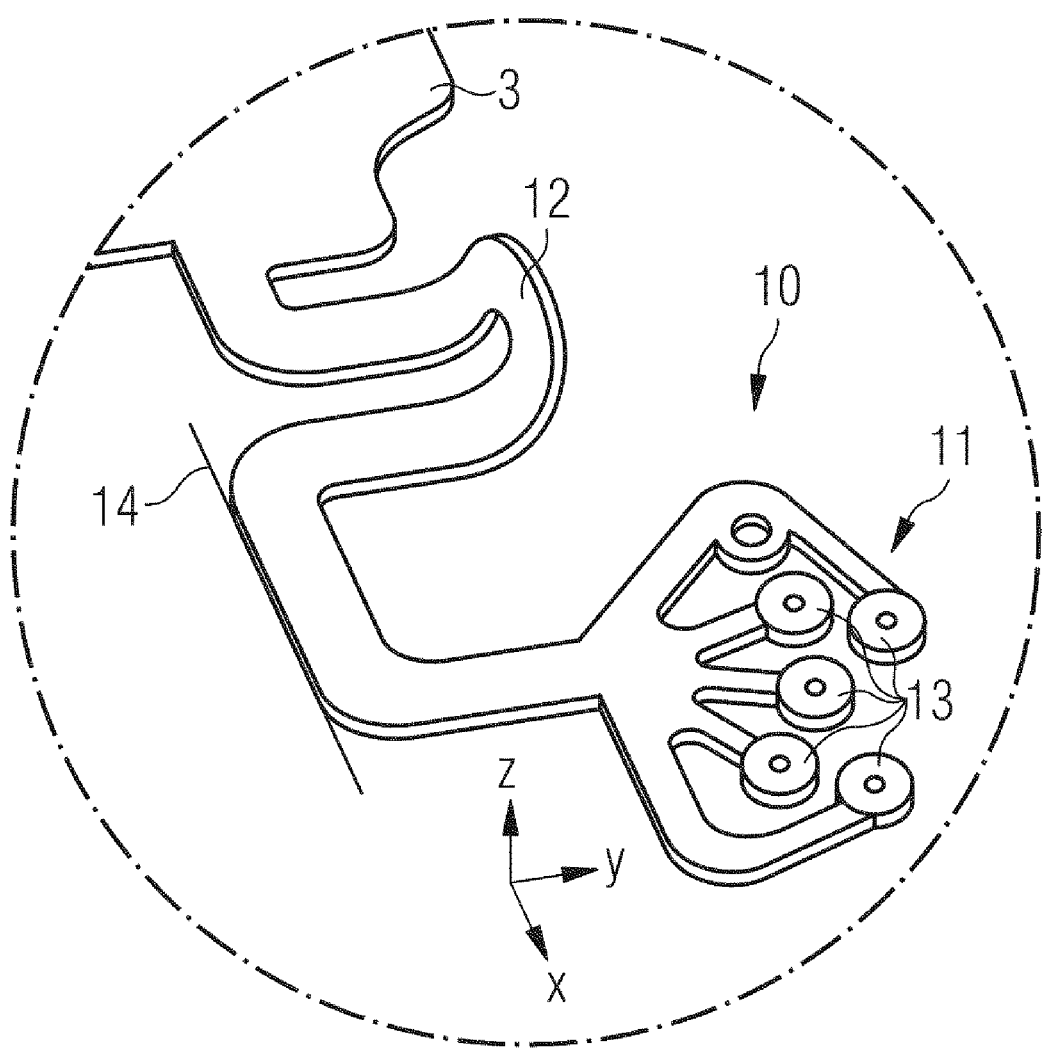
FIG. 2 is an enlarged, perspective view of area A shown in FIG. 1.

The first limb 10 with a free end movable in at least two mutually perpendicular planes is indicated in FIG. 1 by reference A and is illustrated in an enlarged view of FIG. 2.

Figure 3:
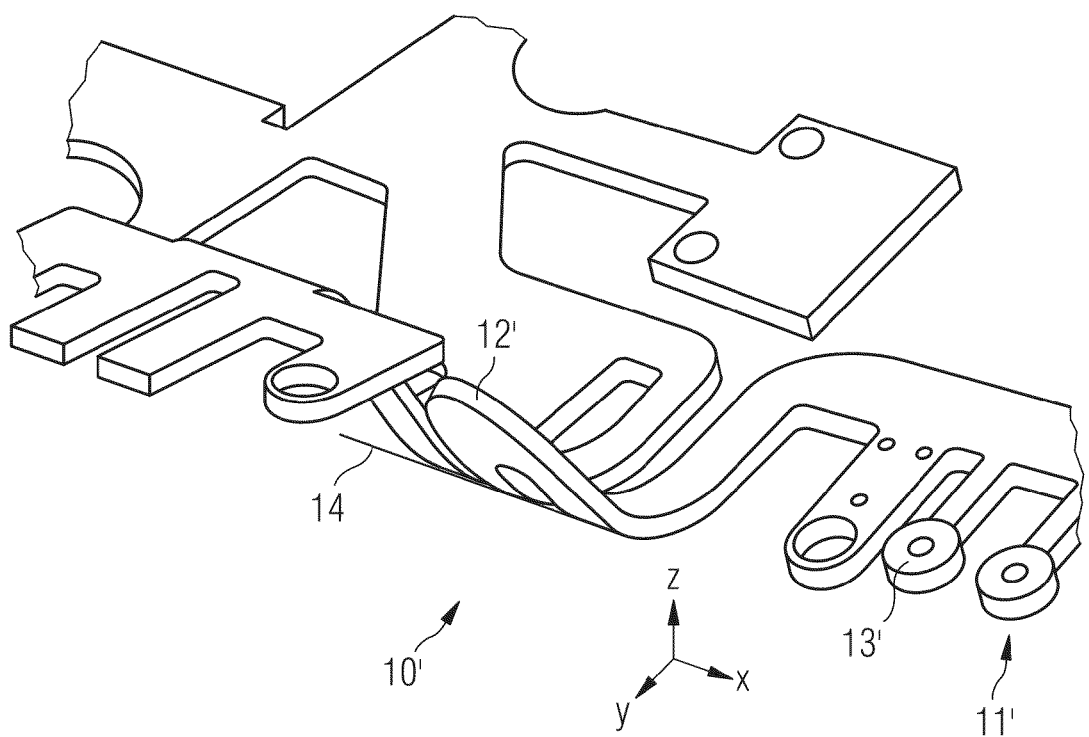
FIG. 3 is an enlarged, perspective view of area B shown in FIG. 1.

The second integral limb 10' shaped so as to provide the free end 11' with a predetermined movement in at least two mutually perpendicular planes is indicated with reference B and is illustrated in the enlarged view of FIG. 3.

The first integral limb 10 shaped to provide a predetermined movement in three mutually perpendicular planes is illustrated in FIG. 2. The limb 10 is shaped so as to extend in a meander and includes a generally U-shaped loop 12. The sides of the U extend generally perpendicularly to the neighbouring regions of the limb 10. The open side of the U-shaped loop 12 is positioned in the plane 14 of the limb 10 and the closed end of the U-shaped loop 12 is bent upwards out of the plane 14 of the limb 10. The shaped limb 10 with its loop 12 enables the free end 11 of the limb 10 to move in an x direction, y direction and z direction as indicated in FIG. 2.

In this embodiment, the free end 11 of the limb 10 is divided into five fingers each ending in a circular contact region 13. The circular contact regions 13 are positioned at the extremity of the free end 11 of the limb 10 and are movable in three mutually perpendicular planes so as to provide spatial tolerance compensation.

A limb 2 extending generally in one direction, for example, a straight rectangular limb, may be movable in a single plane perpendicular to the top surface of the limb, in the notation of FIG. 1, in the z direction. By providing a loop 12 which extends in the plane of the limb 10, the free end 11 of the limb 10 can now not only move in the z direction but also in the x direction, by opening and closing the width of the U-shaped loop 12, to accommodate differences in the distance of the free end 11 of the limb 10 from the body 3 of the rigid circuit board 1.

By bending the closed end of the U-shaped loop 12 out of the plane 14 of the limb 10, the free end 11 of the limb 10 can also move in the y direction and so is movable in three mutually perpendicular planes.

FIG. 3 illustrates an enlarged view of region B of FIG. 1 and illustrates a second limb 10' shaped to provide movement at the free end 11' of the limb 10' in three mutually perpendicular directions. As with the first limb 10, the second limb 10' also includes a loop 12' in its length and a plurality of contact areas 13' arranged on its free end 11'. The limb 10' extends generally in x direction and the loop 12' extends in the y direction and is bent upwards out of the plane 14 of the limb 10' in the z direction.

For ease of illustration, the directions of movement are illustrated in connection with the partial cross-sectional view of a limb in FIG. 4. The limb extends generally in the x-y plane and contains a loop extending generally in the y direction and bent upwards in the z direction out of the x-y plane 14.

The rigid circuit board 1 may be fabricated by stamping the desired outer contour including the integral limbs 2 10; 10' and loops 12 12' from a rectangular or square rigid circuit board. A limb 10 with the loop 12 may then be further worked to bend the closed end of the loop 12 out of the plane 14 of the limb 10 so as to provide movement at the free end 11 of the limb 10 in three mutually perpendicular directions. In the view of FIG. 4, the closed end of the loop may also be bent downwards with respect to the plane 14 of the limb 10 as well as upwards as illustrated in FIG. 4.

The rigid circuit board 1 also contains a plurality of bent or deformed portions 15 to enable connections to be made to further components whose position is predetermined by the application. These bent portions 15 may contain movement in a single direction, that is the z direction perpendicular to the upper surface of the circuit board for the bent portions 15 extending in a limb 2.

Therefore, the rigid circuit board 1 is provided which has stable essentially immovable regions 15 as well as at least one limb 10, 10' shaped to provide movement in the free end 11, 11' of the limb 10, 10'. A rigid circuit board 1 with spatial tolerance can be provided without requiring more expensive flexible circuit board material. Furthermore, additional connections between a flexible circuit board and a rigid circuit board are avoided thus reducing the assembly costs.

The invention claimed is:

1. A rigid circuit board, comprising:
    at least one integral limb shaped to provide predetermined movement at a free end of said limb in three mutually perpendicular planes;
    said limb extending in a plane in first direction, said limb formed with a generally U-shaped loop extending in the plane laterally with respect to the first direction; and
    said loop formed with an open side and a closed side, said open side disposed in the plane of said limb and said closed side disposed out of the plane of said limb.

2. The rigid circuit board according to claim 1, wherein said free end of said limb has at least one contact region.

3. The rigid circuit board according to claim 1, wherein said limb is shaped to provide three-dimensional resilience of said free end of said limb.

4. The rigid circuit board according to claim 1, wherein said loop is bent out of the plane of said limb.

5. The rigid circuit board according to claim 1, wherein the rigid circuit board contains an electrically insulating substrate formed from one of FR-2—Phenolic cotton paper, FR-3—Cotton paper and epoxy, FR-4—Woven glass and epoxy, FR-5—Woven glass and epoxy, FR-6—Matte glass and polyester, G-10—Woven glass and epoxy, CEM-1—Cotton paper and epoxy, CEM-2—Cotton paper and epoxy, CEM-3—Woven glass and epoxy, CEM-4—Woven glass and epoxy, and CEM-5—Woven glass and polyester.

6. A mechatronic control system, comprising:
    a rigid circuit board having at least one integral limb shaped to provide predetermined movement at a free end of said limb in three mutually perpendicular planes;
    said limb extending in a plane in first direction, said limb formed with a generally U-shaped loop extending in the plane laterally with respect to the first direction; and
    said loop formed with an open side and a closed side, said open side disposed in the plane of said limb and said closed side disposed out of the plane of said limb.

7. The mechatronic control system according to claim 6, said rigid circuit board contains a plurality of bent portions; and
    further comprising electronic components at least one of disposed on and electrically connected to said bent portions.

8. The mechatronic control system according to claim 6, wherein the mechatronic control system is an automatic gear box control module.

\* \* \* \* \*